US006300669B1

(12) United States Patent
Kinoshita

(10) Patent No.: US 6,300,669 B1
(45) Date of Patent: Oct. 9, 2001

(54) SEMICONDUCTOR INTEGRATED CIRCUIT DEVICE AND METHOD OF DESIGNING SAME

(75) Inventor: Yasushi Kinoshita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/160,040

(22) Filed: Sep. 25, 1998

(30) Foreign Application Priority Data

Sep. 29, 1997 (JP) .................................................. 9-264342

(51) Int. Cl.$^7$ .................................................. H01L 29/00
(52) U.S. Cl. .......................... 257/566; 330/295; 330/296; 330/297; 330/298; 330/299; 330/300; 330/301; 330/302; 330/303; 330/304; 330/305; 330/306; 330/307; 330/308; 330/309; 330/310; 257/566; 257/567; 438/202; 438/203; 438/204; 438/205; 438/313; 438/340; 327/379; 327/384; 327/478; 327/491
(58) Field of Search .................................... 330/295–310; 257/566, 567; 438/202–205, 340, 313; 327/379, 384, 478, 491

(56) References Cited

U.S. PATENT DOCUMENTS

| | | | |
|---|---|---|---|
| 5,047,732 | * | 9/1991 | Tanaami ................................. 330/295 |
| 5,359,295 | * | 10/1994 | Nishimura ............................. 330/295 |
| 5,896,062 | * | 4/1999 | Tiller et al. ............................ 330/252 |
| 5,962,913 | * | 10/1999 | Honda ................................... 257/587 |
| 6,046,639 | * | 9/1998 | Kudo ..................................... 330/252 |

FOREIGN PATENT DOCUMENTS

| | | |
|---|---|---|
| 52-28878 | 3/1977 | (JP) . |
| 53-117984 | 10/1978 | (JP) . |
| 6-163561 | 6/1994 | (JP) . |
| 7-254608 | 10/1995 | (JP) . |

OTHER PUBLICATIONS

Lieshout et al. "Monolithic wideband varible gain amplifier with a high gain range and low distortion" IEEE International solid–state circuits conference 1997 0–7803–3721–2/97 pp. 358–59.*

* cited by examiner

Primary Examiner—Matthew Smith
Assistant Examiner—G. Lee
(74) Attorney, Agent, or Firm—Sughrue, Mion, Zinn, Macpeak & Seas, PLLC

(57) ABSTRACT

A semiconductor integrated circuit device comprises a multiple-stage amplifier including a plurality of transistors. The multiple-stage amplifier has a first stage comprising a plurality of bipolar transistors each having a single emitter structure. The bipolar transistors are connected parallel to each other. The semiconductor integrated circuit device can easily be designed, is of a self-aligned structure, and has a single transistor size. The semiconductor integrated circuit device may be used as a low-noise, high-power-gain high-frequency amplifier.

10 Claims, 10 Drawing Sheets

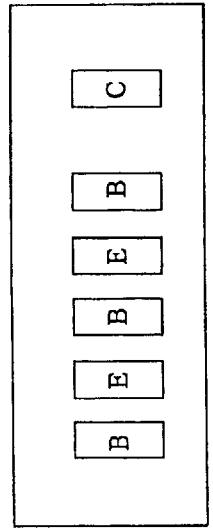
Fig. 1 (a) PRIOR ART
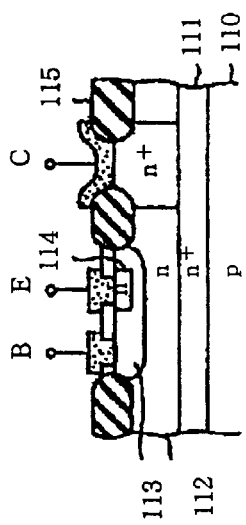
Fig. 1 (b) PRIOR ART
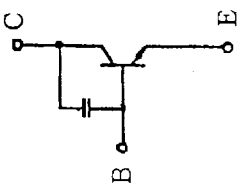
Fig. 1 (c) PRIOR ART
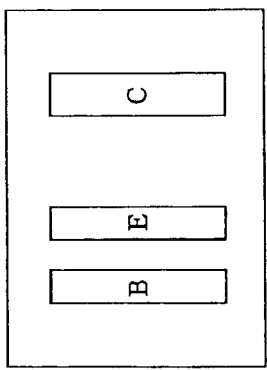
Fig. 1 (d) PRIOR ART
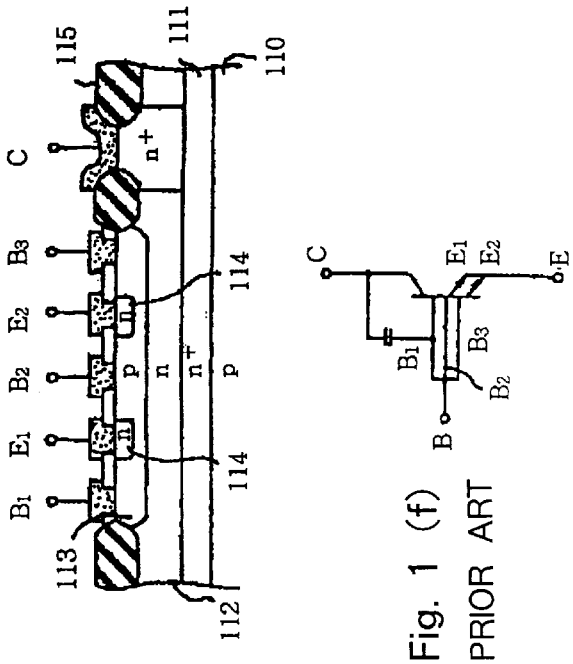
Fig. 1 (e) PRIOR ART
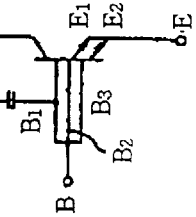
Fig. 1 (f) PRIOR ART

SEMICONDUCTOR INTEGRATED CIRCUIT DEVICE AND METHOD OF DESIGNING SAME

BACKGROUND OF THE INVENTION

1. Field of the Invention

The present invention relates to a low-noise, high-gain semiconductor integrated circuit device comprising bipolar transistors, and method of designing such a low-noise high-gain semiconductor integrated circuit device.

2. Description of the Related Art

In recent years, high-frequency amplifiers which are characterized by a low power requirement, low noise, and a high power gain have become more important for use in the field of mobile communications. Bipolar transistors used in such high-frequency amplifiers are required to have better noise and gain characteristics. It is important for such high-frequency amplifiers to reduce an overall noise figure. Therefore, high-frequency amplifiers need to have improved noise characteristics while maintaining a desired power gain for transistors that are used. However, since there is a trade-off between the power gain characteristics and noise characteristics of transistors, it is difficult to manufacture transistors which satisfy desired power gain characteristics and noise characteristics at a low cost.

Japanese laid-open patent publication No. 7-254608 discloses bipolar transistors having the same emitter area. The disclosed bipolar transistors include a transistor structure having good noise characteristics in a certain current range and a transistor structure having a good gain. These transistor structures are used in different circuits.

FIGS. 1(*a*) through 1(*f*) of the accompanying drawings show bipolar transistors disclosed in Japanese laid-open patent publication No. 7-25408. FIGS. 1(*a*) through 1(*c*) are plan and cross-sectional views and an equivalent circuit diagram, respectively, of a bipolar transistor having a single emitter structure, and FIGS. 1(*d*) through 1(*f*) are plan and cross-sectional views and an equivalent circuit diagram, respectively, of a bipolar transistor having a multiple emitter structure. As shown in FIGS. 1(*b*) and 1(*e*), an $n^+$ embedded layer 111 and an n collector layer 112 are successively disposed on a p Si substrate 110, and a base layer 113, an emitter layer 114, and a device separating insulative film 115 are successively disposed on the n collector layer 112.

In FIGS. 1(*a*) through 1(*c*), a single emitter layer 114 is disposed in the base layer 113. In FIGS. 1(*d*) through 1(*f*), two emitter layers 114 are disposed in the base layer 113. Each of the emitter layers 114 of the multiple emitter structure has a width half the width of the emitter layer 114 of the single emitter structure. However, the total emitter area of the single emitter structure is the same as the total emitter area of the multiple emitter structure.

FIG. 2 of the accompanying drawings shows the relationship between the collector current, and the noise figures and power gain of the conventional bipolar transistors shown in FIGS. 1(*a*) through 1(*f*). As shown in FIG. 2, the multiple emitter bipolar transistor having the plural emitters has a lower noise figure than the single emitter bipolar transistor having the single emitter in a certain collector current range. On other hand, the power gain of the single emitter bipolar transistor is better than the multiple emitter bipolar transistor in all collector current ranges. Instead of improving these noise figure and power gain characteristics through device and circuit approaches, these two bipolar transistors are simply used in different circuits.

The conventional bipolar transistors suffer the following disadvantages:

First, it is not easy to distinguish a device section where more importance should be attached to the power gain characteristics from a device section where more importance should be attached to the noise characteristics in a circuit, and hence device designing is complicated.

Secondly, the total emitter area in the single emitter bipolar transistor is the same as the total emitter area in the multiple emitter bipolar transistor. That is, these bipolar transistor have different emitter lengths, indicating that there are a plurality of bipolar transistors having different emitter structures in a circuit.

The conventional bipolar transistors are not of a so-called self-aligned structure with a base region constructed of polycrystalline silicon or the like. Generally, it is important for bipolar transistors which operate in a high-frequency range such as a GHz range to have improved high-frequency characteristics by reducing the base resistance. Therefore, bipolar transistors with a base electrode constructed of polycrystalline silicon are more preferable in terms of a noise figure and a power gain than the conventional non-self-aligned bipolar transistors. Bipolar transistors having a shorter emitter width tend to suffer a plug effect on emitters because the aspect ratio of an emitter contact is greater than the non-self-aligned bipolar transistors.

The plug effect is a phenomenon in which when an impurity is diffused from an emitter region, the impurity is subject to less diffusion in a transistor structure with a smaller emitter width than in a transistor structure with a greater emitter width. Usually, the thermal history of a transistor is adjusted in the fabrication process to optimize the depth of an emitter-to-base junction of a transistor structure with a smaller emitter width in view of the plug effect. Therefore, in a transistor structure with a greater emitter width, an emitter impurity is diffused more deeply due to the plug effect, tending to cause a punchthrough between the emitter and the collector. For this reason, it is important to employ a single fixed transistor size in a circuit for the stable fabrication of transistors with a high yield.

SUMMARY OF THE INVENTION

It is therefore an object of the present invention to provide a semiconductor integrated circuit device which can be easily designed, is of a self-aligned structure, and has a single transistor size, for use as a low-noise, high-power-gain high-frequency amplifier.

According to the present invention, there is provided a semiconductor integrated circuit device comprising a multiple-stage amplifier including a plurality of transistors, the multiple-stage amplifier having a first stage comprising a plurality of bipolar transistors each having a single emitter structure, the bipolar transistors being connected parallel to each other.

The bipolar transistors may have a common collector.

Each of the bipolar transistors may comprise a self-aligned bipolar transistor having an emitter electrode and a base electrode which are made of polycrystalline silicon.

Each of the bipolar transistors may have an emitter having a length ranging from 20 to 30 $\mu$m and a width ranging from 0.5 to 0.8 $\mu$m.

According to the present invention, there is also provided a method of designing a semiconductor integrated circuit device having a multiple-stage amplifier including a plurality of transistors, comprising the step of constructing a first stage of the multiple-stage amplifier of a plurality of bipolar transistors each having a single emitter structure, the bipolar transistors being connected parallel to each other.

It has been found from the results of experiments conducted by the inventor that it is possible to reduce a noise level without causing a substantial reduction in gain simply by connecting self-aligned bipolar transistors of one emitter size parallel to each other. With the above arrangement of the present invention, the semiconductor integrated circuit device offers such an advantage, and is capable of amplifying an input signal with a reduced noise level.

FIG. 3 of the accompanying drawings shows the relationship between the total collector current $I_c$ (mA) and noise figure $NF_{min}$ (dB) of bipolar transistors. FIG. 4 of the accompanying drawings shows the relationship between the collector current $I_c$ (mA) and forward transfer gain $|S_{21e}|^2$ of bipolar transistors. Each of FIGS. 3 and 4 plots the relationship for a single minimum transistor, two parallel-connected transistors, and four parallel-connected transistors. In each of FIGS. 3 and 4, type A represents a bipolar transistor having an emitter width of 0.8 μm and an emitter length of 1.6 μm, and type B represents a bipolar transistor having an emitter width of 0.8 μm and an emitter length of 6.4 μm. The number associated with type A and type B indicates the number of parallel-connected transistors.

As can be seen from FIGS. 3 and 4, as the number of parallel-connected transistors increases, the noise level decreases, and the forward transfer gain increases. The transistors which are compared have different total emitter areas. FIGS. 3 and 4 show the transistor type B having a single emitter structure whose emitter area is the same as the emitter area of a structure composed of four parallel-connected minimum transistors type A. A comparison between these structures indicate that the forward transfer gain of the single emitter structure is slightly better than the forward transfer gain of the structure composed of four parallel-connected minimum transistors type A, as shown in FIG. 4, whereas the noise level of the structure composed of four parallel-connected minimum transistors type A is lower than the noise level of the single emitter structure, as shown in FIG. 3. Inasmuch as the forward transfer gain is maintained at an original level of at least 25 dB, the gain difference between the transistors of low-noise amplifiers is not significant, but reducing the noise figure is more advantageous.

Amplifiers in most integrated circuits are designed in multiple stages. In each stage, the amplifier performs the function of a voltage gain, a current gain, or an input-to-output impedance conversion. In general, it is widely practiced to connect amplifiers in cascade for increasing the overall amplification factor. Specifically, a plurality of amplifiers having different noise figures and power gains are connected in cascade. If the amplifier of a Jth stage of a multiple-stage integrated circuit has a gain $G_j$ and a noise figure $F_j$, then the sum F of noise powers of the multiple-stage integrated circuit is expressed by:

$$F = F_1 + (F_2-1)/G_1 + \ldots + F_{n-1}/(G_1(G_2 \ldots G_{n-1}))$$

This equation is referred to as the Friss equation. As can be understood from the above equation, if the gain $G_1$, of the first stage is sufficiently high, then the noise figures of the second and following stages have only a small effect even when they are large.

Consequently, if bipolar transistors of the first-stage amplifier, which are of a single emitter structure and have the same emitter size, are connected parallel to each other, then the resultant integrated circuit has best power gain characteristics and noise characteristics.

The above and other objects, features and advantages of the present invention will become apparent from the following description with reference to the accompanying drawings which illustrate examples of the present invention.

BRIEF DESCRIPTION OF THE DRAWINGS

FIGS. 1(a) through 1(f) show conventional bipolar transistors;

DETAILED DESCRIPTION OF THE PREFERRED EMBODIMENTS

Figure 2:
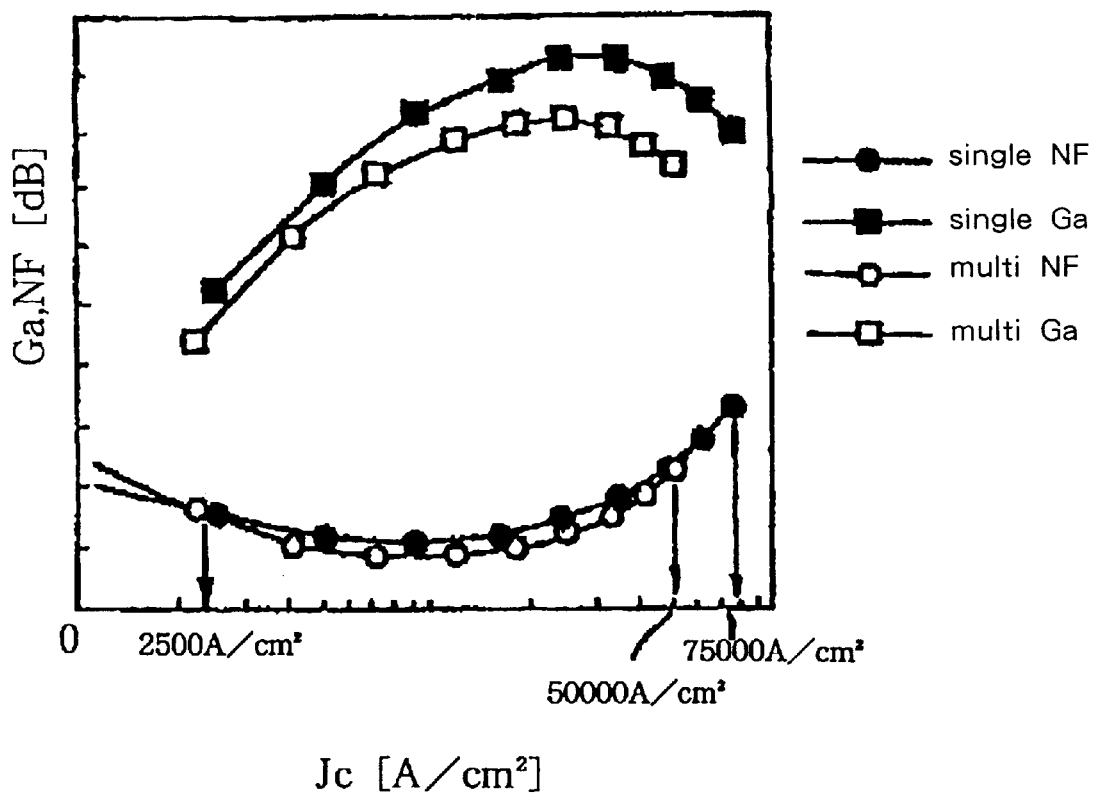
FIG. 2 is a diagram showing the relationship between the collector current, and the noise figure and power gains of the conventional bipolar transistors shown in FIGS. 1(a) through 1(f)
Figure 3:
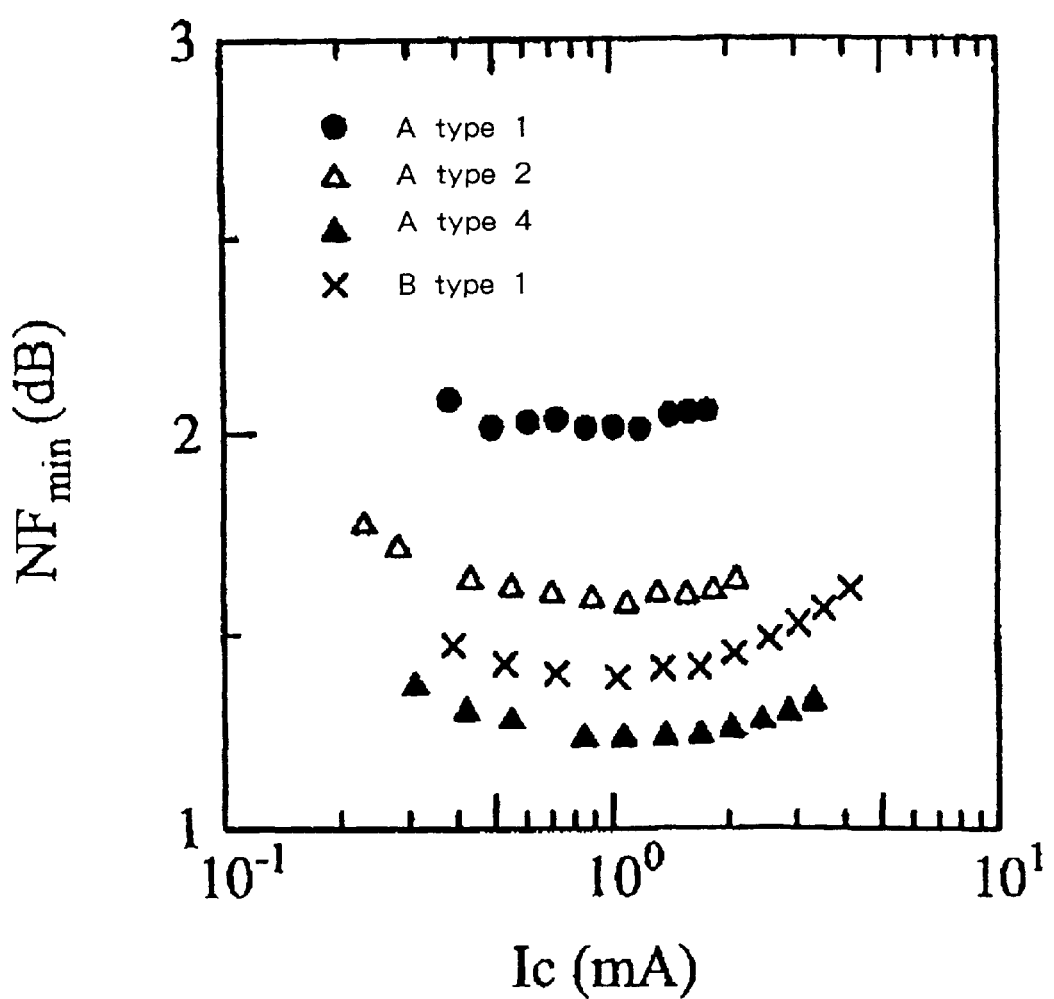
FIG. 3 is a diagram showing the relationship between the collector current and noise figure of self-aligned bipolar transistors.
Figure 4:
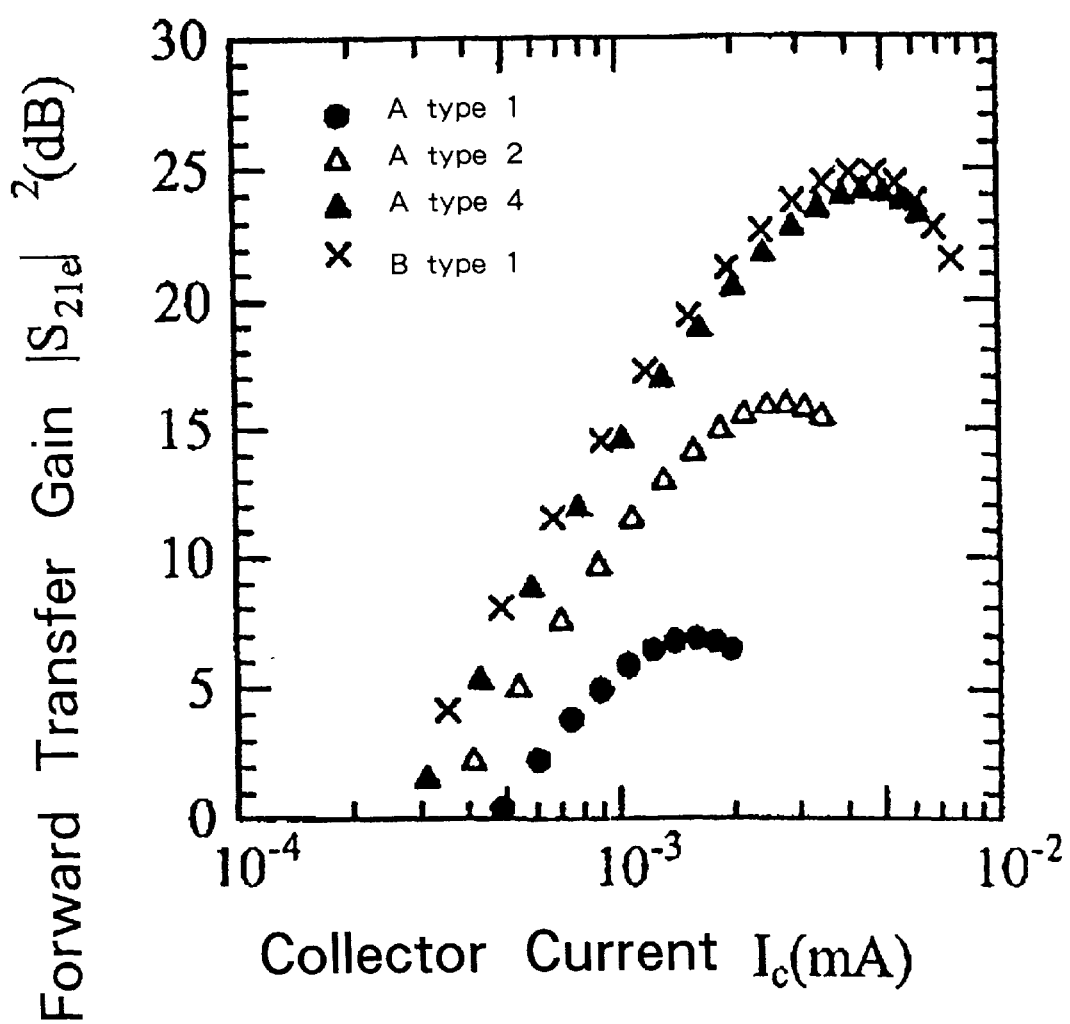
FIG. 4 is a diagram showing the relationship between the collector current and forward transfer gain of self-aligned bipolar transistors.
Figure 5:
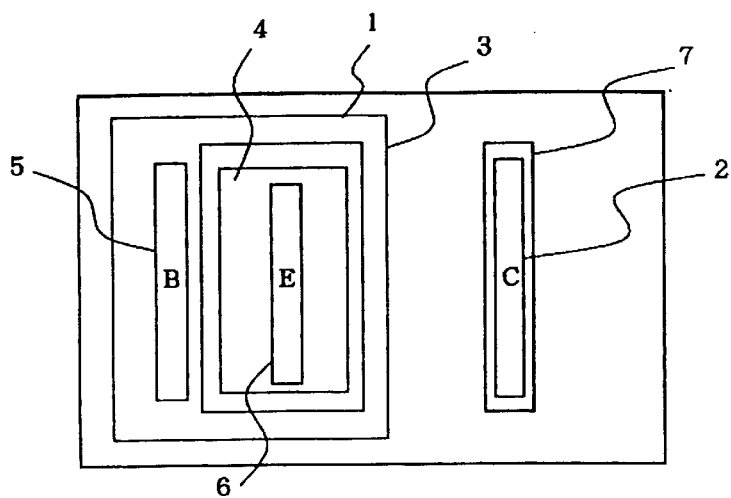
FIGS. 5(a) through 5(c) show a transistor for use in an amplifier according to a first embodiment of the present invention.
Figure 5:
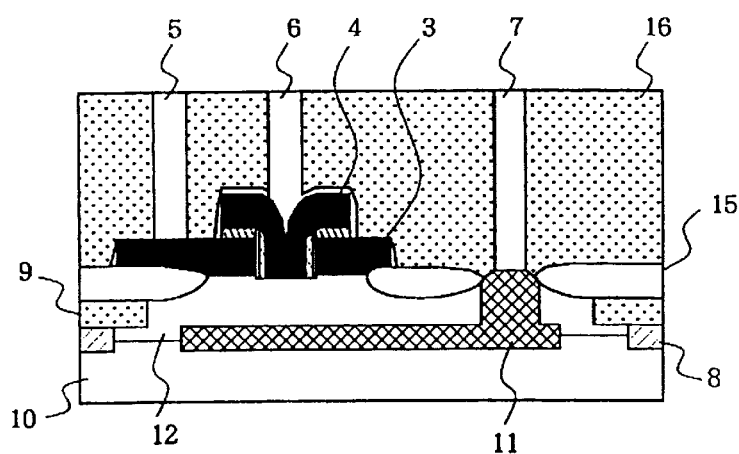
Figure 5:
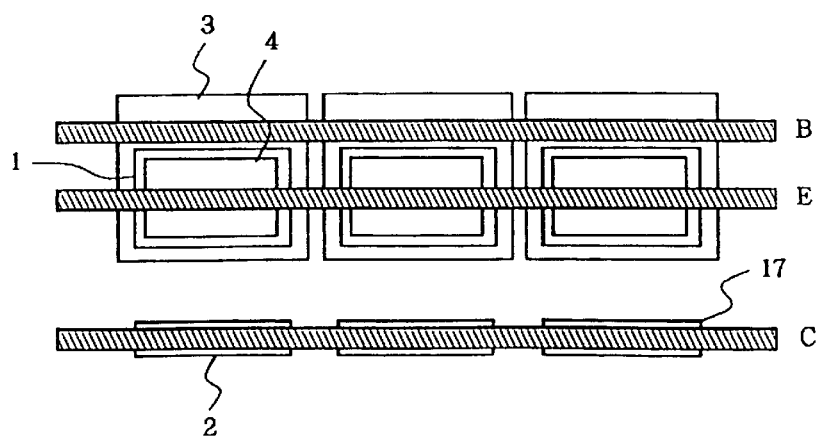

FIGS. 5(a) through 5(c) show a basic transistor for use in an amplifier according to a first embodiment of the present invention. Specifically, FIG. 5(a) is a plan view of the basic transistor which is of a single emitter structure, and FIG. 5(b) is a cross-sectional view of the basic transistor.

As shown in FIGS. 5(a) and 5(b), the basic transistor comprises a base (B) diffusion layer 1, a collector (C) diffusion layer 2, a base polysilicon region 3, an emitter (E) polysilicon region 4, a contact 5 on the base polysilicon region 3, a contact 6 on the emitter polysilicon region 4, a contact 7 on the collector diffusion layer 2, a $p^+$ embedded layer 8, a p well 9, an Si substrate 10, a device separating insulative film 15, and an interlayer insulative film 16. The transistor is of a so-called self-aligned structure with a base region constructed of polycrystalline silicon or the like. The $p^+$ embedded layer 8 and the p well 9 are provided for separating the device of the bipolar transistor, and are disposed in surrounding relation to the bipolar transistor.

FIG. 5(c) is a view showing three parallel-connected transistors each having the same size as the basic transistor shown in FIGS. 5(a) and 5(b). The bases, emitters, and collectors of the three parallel-connected transistors are interconnected by aluminum interconnections 17.

Figure 6:
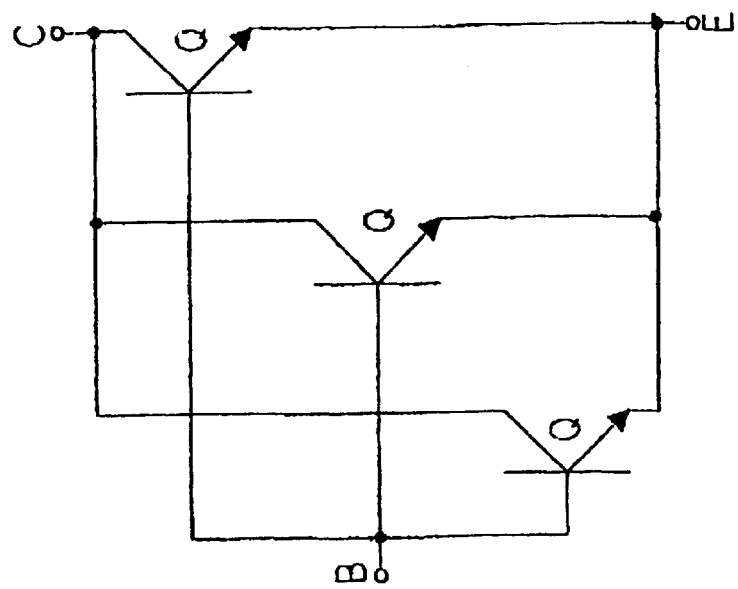
FIGS. 6(a) and 6(b) are circuit diagrams of an amplifier which incorporates transistors according to the present invention.
Figure 6:
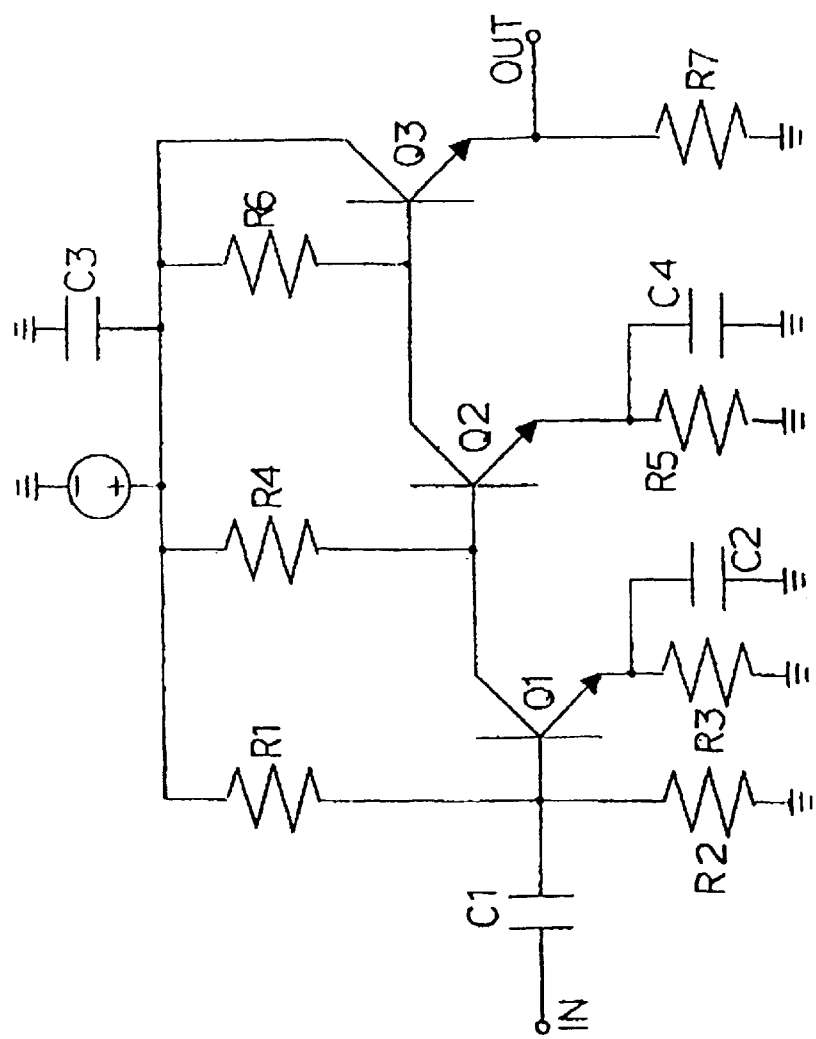

FIG. 6(a) is a circuit diagram of an amplifier which incorporates the transistors according to the present invention. The amplifier comprises a two-stage emitter-grounded amplifier and an emitter-follower buffer. An input signal applied from a signal source to an input terminal IN is supplied to a capacitor C1, which cuts off a DC component from the input signal. The input signal is then supplied to the amplifier which comprises transistors Q1, Q2. Resistors R1–R6 serve to give self biases to the transistors Q1, Q2, and capacitors C1, C2 serve to prevent the amplification factor from being lowered for high-frequency compensation. The emitter-follower buffer comprises a transistor Q3 and a resistor R7 for ensuring a sufficient current for operating a next circuit. The transistor Q1 is shown as a single transistor in FIG. 6(a), but actually comprises three transistors Q connected parallel to each other, as shown in FIG. 6(b), the transistors Q being of the same structure and size as the transistors Q2, Q3. If the transistor Q2 were of the same structure as the transistor Q1, then the noise figure of the amplifier would be increased. Therefore, only the first stage of the amplifier comprises parallel-connected transistors.

Figure 7:
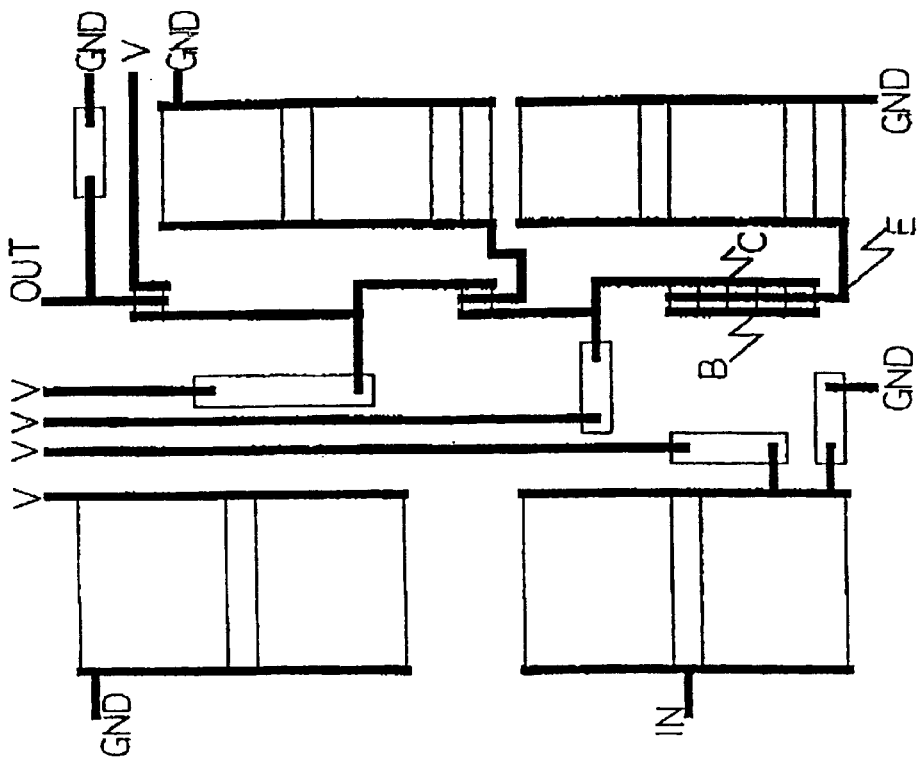
FIGS. 7(a) and 7(b) are diagrams showing layouts of the amplifier on a silicon substrate.
Figure 7:
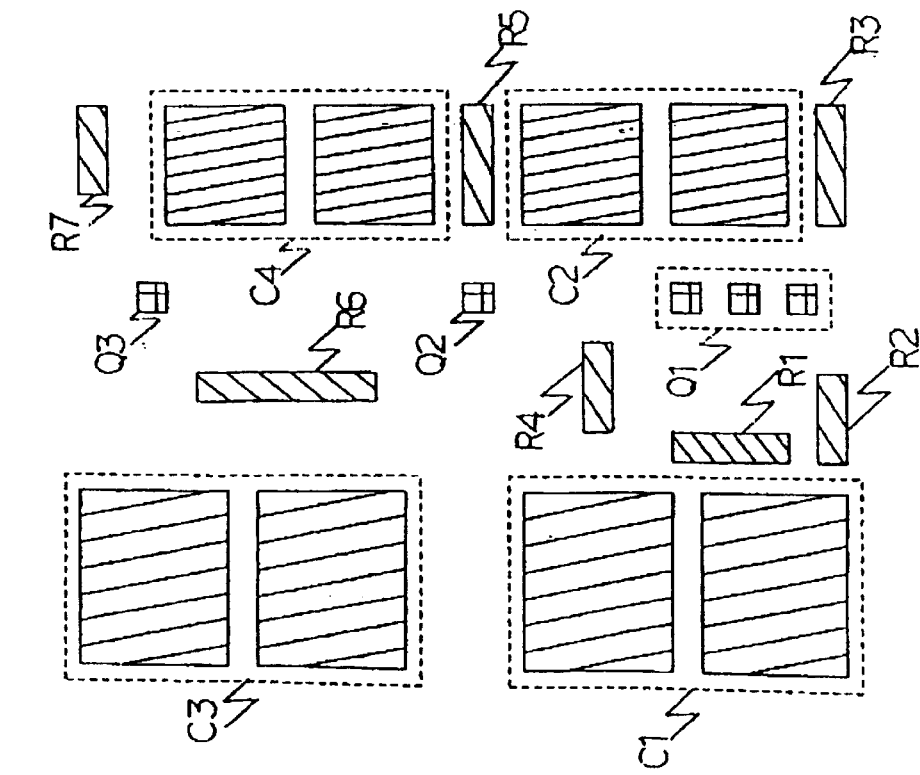

FIGS. 7(a) and 7(b) show layouts of the amplifier on a silicon substrate. Specifically, FIG. 7(a) illustrates a layout of transistors Q1–Q3, resistors R1–R7, and capacitors C1–C4. The transistors and the capacitors of the two-stage amplifier are indicated as enclosed by dotted lines, and connected parallel to each other, making up the amplifier.

FIG. 7(b) illustrates the manner in which the components are connected. It can be seen from FIG. 7(b) that since the capacitors take up a much larger area than the transistors, any increase in the area due to the parallel connection of the transistors of the two-stage amplifier poses almost no problem.

Figure 8:
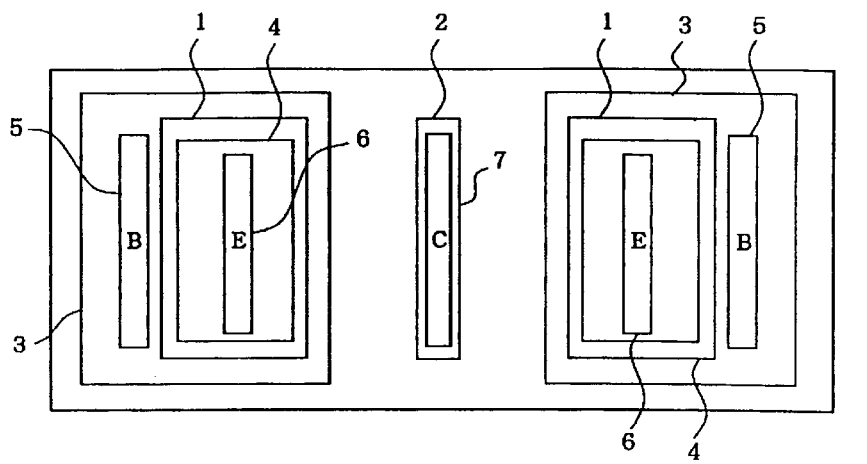
FIGS. 8(a) through 8(c) show transistors for use in an amplifier according to a second embodiment of the present invention.
Figure 8:
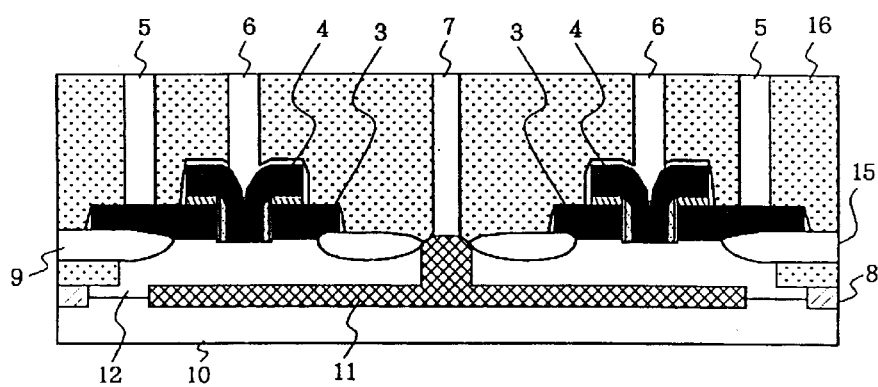
Figure 8:
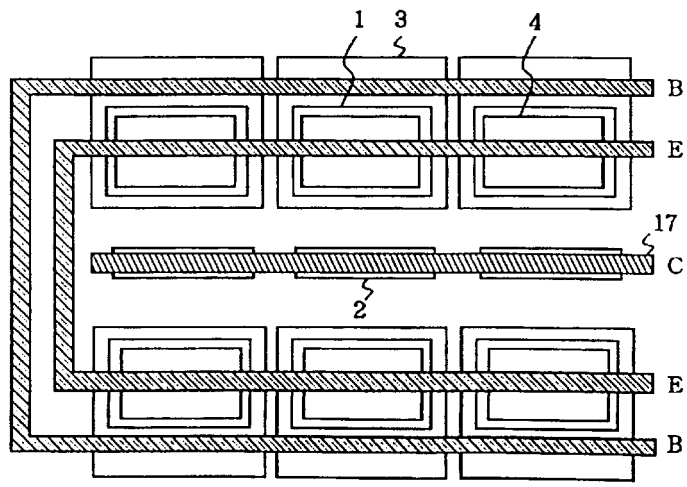

FIGS. 8(a) through 8(c) show transistors for use in an amplifier according to a second embodiment of the present invention.

As shown in FIGS. 8(a) through 8(c), two transistors having a common collector in a substrate are used as a basic component. These transistors which are connected parallel to each other are used in a first stage of an amplifier. Various parts of the transistors which are identical to those of the transistor shown in FIGS. 5(a) through 5(c) are denoted by identical reference numerals, and will not be described in detail below.

With the arrangement according to the second embodiment, the area occupied by the transistors is reduced, and the number of parallel-connected transistors is increased.

Figure 9:
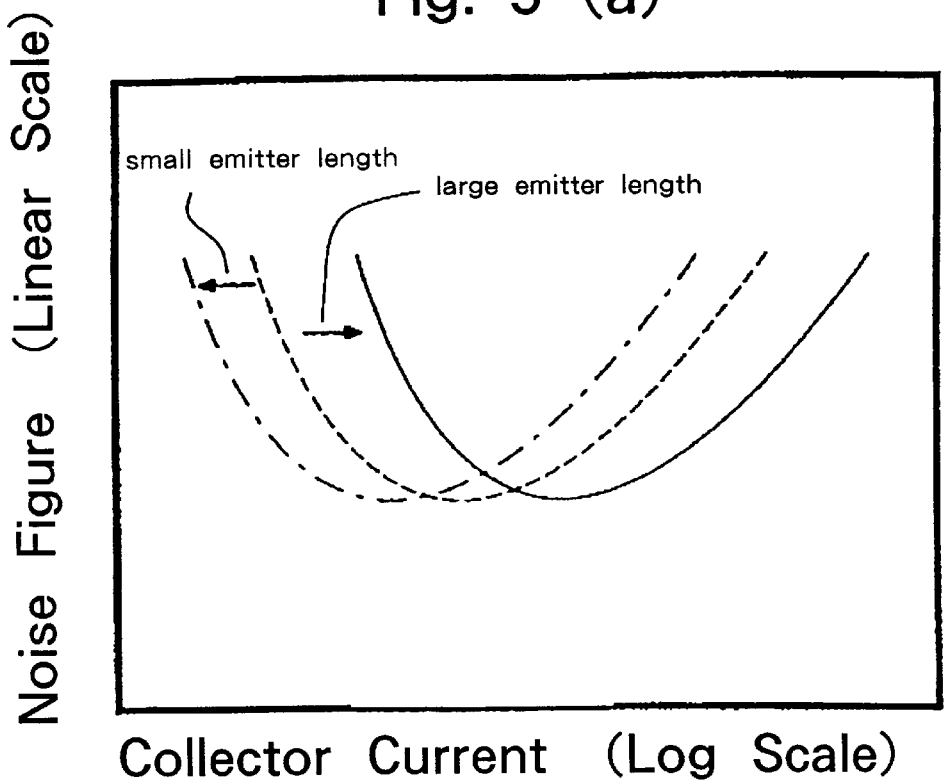
FIGS. 9(a) and 9(b) are graphs showing how a noise figure varies depending on the emitter size of a transistor.
Figure 9:
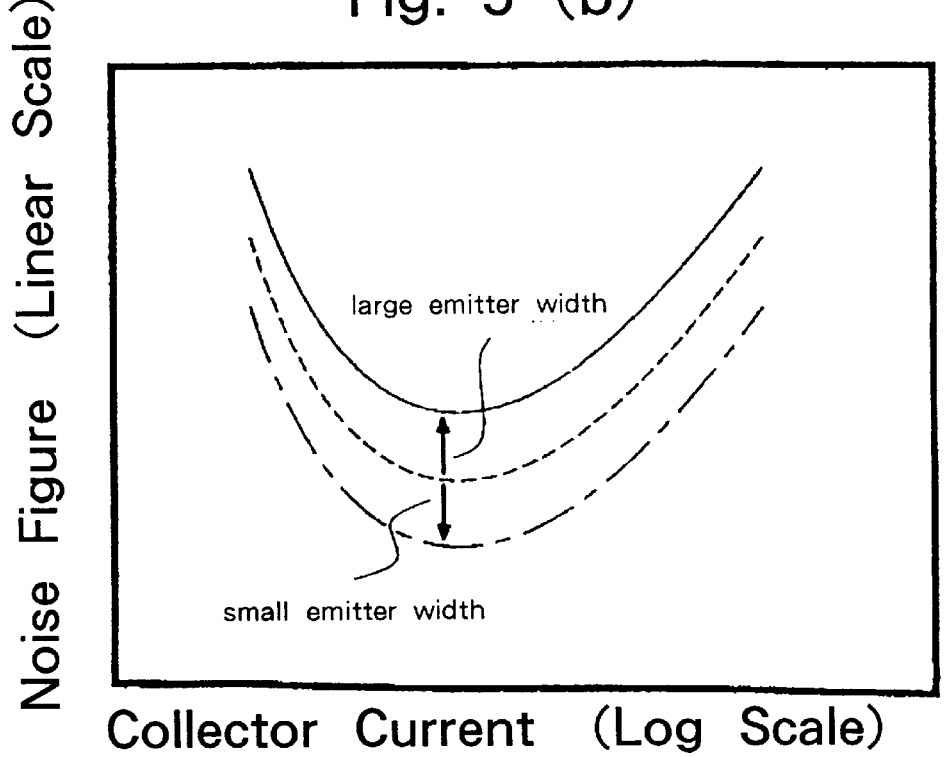

In order to achieve the above advantages, the emitter size of transistors that are used is limited. FIGS. 9(a) and 9(b) show how a noise figure varies depending on the emitter size of a transistor. Specifically, FIG. 9(a) shows the dependency of the relationship between a noise figure and a collector current on an emitter length, and FIG. 9(b) shows the dependency of the relationship between a noise figure and a collector current on an emitter width. In FIGS. 9(a) and 9(b), a dotted-line reference curve shifts to a solid-line curve when the emitter length and the emitter width increase, and shifts to a dot-and-dash-line curve when the emitter length and the emitter width decrease. These curve shifts correspond to changes in the base resistance and the collector-to-base and base-to-emitter parasitic capacitances. Thus, the emitter length is in trade-off relation to the power gain and the noise figure.

Figure 10:
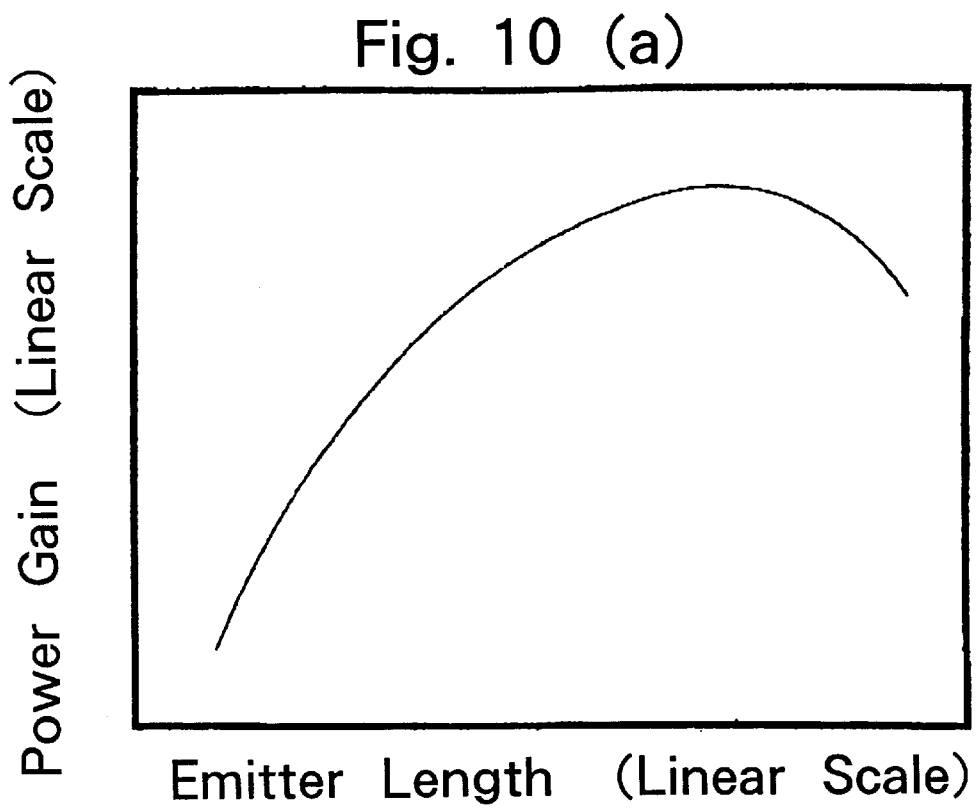
FIGS. 10(a) and 10(b) are graphs showing the dependency of a power gain on the emitter size of a transistor.
Figure 10:
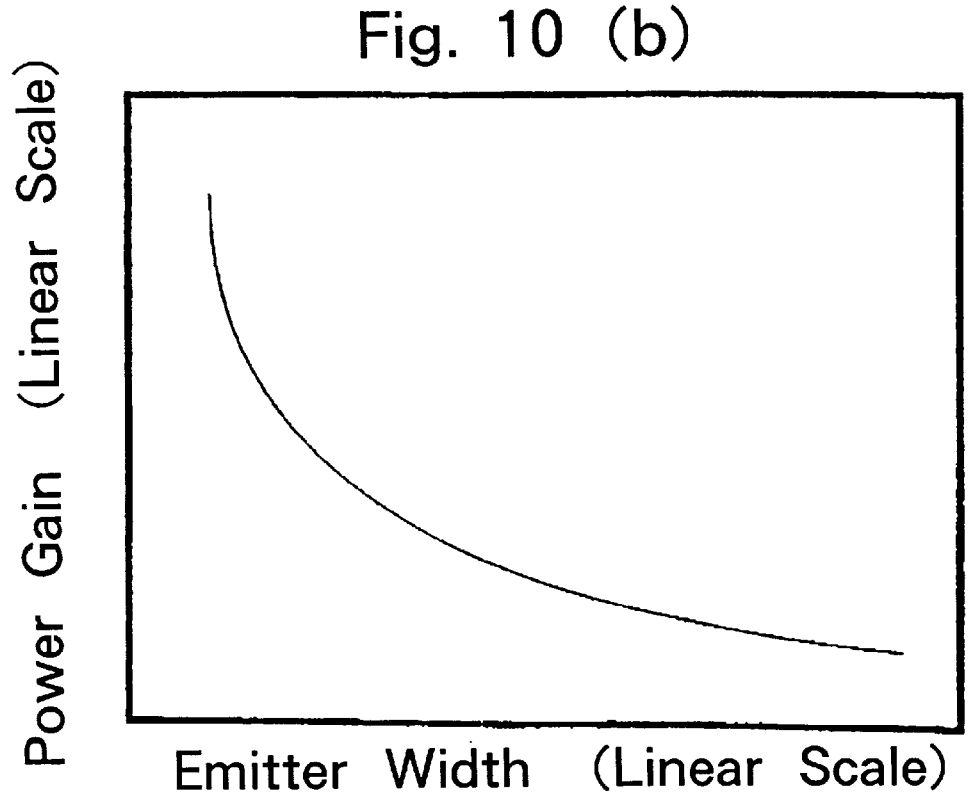

FIGS. 10(a) and 10(b) show the dependency of a power gain on the emitter size of a transistor. Specifically, FIG. 10(a) shows the dependency of a power gain on an emitter length, and FIG. 10(b) shows the dependency of a power gain on an emitter width. A study of FIG. 10(a) indicates that as the emitter length increases, the power gain increases, but the power gain starts to decrease at a certain emitter length. This is because as the emitter length increases, the overall size of the transistor increases, causing an increase in the parasitic capacitance to exceed a reduction in the base resistance. As can be seen from FIG. 10(b), as the emitter width increases, the power gain decreases continuously. This is because the parasitic capacitance and the base resistance increase as the emitter width increases.

Consequently, the emitter length is determined depending on the value to which the collector current is to be set in order to reduce the noise figure and increase the power gain. Though the emitter width is preferably as small as possible, it is determined depending on the plug effect of the emitter. According to an experiment conducted by the inventor, a most suitable actual emitter size was 20–30 $\mu$m in terms of an emitter length and 0.5–0.8 $\mu$m in terms of an emitter width. However, these values vary with the layout of bipolar transistors because they are determined depending on a balance between the parasitic capacitance and the parasitic resistance.

The semiconductor integrated circuit device according to the present invention offers the following advantages:

Since there is only one basic transistor, the semiconductor integrated circuit device can be easily designed.

Circuits can be designed in a short period of time because no process is required to use single emitter and multiple emitter transistors in respective circuits.

While preferred embodiments of the present invention have been described using specific terms, such description is for illustrative purposes only, and it is to be understood that changes and variations may be made without departing from the spirit or scope of the following claims.

What is claimed is:

1. A semiconductor integrated circuit device comprising a multiple-stage amplifier including a plurality of transistors, each having a base resistor with a first end connected to a respective base and a second end connected to the other base resistor, said multiple-stage amplifier having a first stage comprising a plurality of bipolar transistors each having a single emitter structure, said first stage bipolar transistors being connected in parallel with each other and having base, collector, and emitter nodes, respectively, connected to each other.

2. A semiconductor integrated circuit device according to claim 1, wherein said first stage bipolar transistors have a common collector.

3. A semiconductor integrated circuit device according to claim 2, wherein each of said bipolar transistors comprises a self-aligned bipolar transistor having an emitter electrode and a base electrode which are made of polycrystalline silicon.

4. A semiconductor integrated circuit device according to claim 2, wherein each of said bipolar transistors has an emitter having a length ranging from 20 to 30 $\mu$m and a width ranging from 0.5 to 0.8 $\mu$m.

5. A semiconductor integrated circuit device according to claim 1, wherein each of said bipolar transistors comprises a self-aligned bipolar transistor having an emitter electrode and a base electrode which are made of polycrystalline silicon.

6. A semiconductor integrated circuit device according to claim 1, wherein each of said bipolar transistors has an emitter having a length ranging from 20 to 30 $\mu$m and a width ranging from 0.5 to 0.8 $\mu$m.

7. A method of designing a semiconductor integrated circuit device having a multiple-stage amplifier including a plurality of transistors, each having a base resistor with a first end connected to a respective base and a second end connected to the other base resistors, comprising the steps of:

constructing a first stage of said multiple-stage amplifier with a plurality of bipolar transistors, each bipolar transistor having, a single emitter structure; and connecting said first stage bipolar transistors in parallel with each other, and connecting respective base collector, and emitter nodes to each other.

8. A method according to claim 7, wherein said first stage bipolar transistors have a common collector.

9. A semiconductor integrated circuit device comprising a multiple-stage amplifier including a plurality of transistors, each having a base resistor with a first end connected to a respective base and a second end connected to the other base resistors, said multiple-stage amplifier having a first stage comprising a plurality of bipolar transistors each having a single emitter structure, said bipolar transistors being connected parallel to each other, wherein each of said bipolar transistors has an emitter having a length ranging from 20 to 30 $\mu$m and a width ranging from 0.5 to 0.8 $\mu$m.

10. A semiconductor integrated circuit device comprising a multiple-stage amplifier including a plurality of transistors, each having a base resistor with a first end connected to a respective base and a second end connected to the other base resistors, said multiple-stage amplifier having a first stage comprising a plurality of bipolar transistors each having a single emitter structure, said bipolar transistors being connected parallel to each other, wherein said bipolar transistors have a common collector and wherein each of said bipolar transistors has an emitter having a length ranging from 20 to 30 $\mu$m and a width ranging from 0.5 to 0.8 $\mu$m.

* * * * *